United States Patent

[11] 3,617,771

[72] Inventor Don N. Lee
Willingboro, N.J.

[21] Appl. No. 838,828
[22] Filed July 3, 1969
[45] Patented Nov. 2, 1971
[73] Assignee Computer Test Corporation

[54] DIFFERENTIAL SWITCHING SYSTEM FOR SWITCHING LOW-LEVEL SIGNALS
11 Claims, 3 Drawing Figs.

[52] U.S. Cl. .................................................... 307/242, 307/254, 307/259, 330/30 D
[51] Int. Cl. .................................................... H03k 17/00
[50] Field of Search ..........................................307/241–243, 256, 257, 259, 254; 330/30, 30 D, 69; 328/95, 96

[56] References Cited

UNITED STATES PATENTS

| | | | |
|---|---|---|---|
| 3,179,817 | 4/1965 | Bounsall ....................... | 307/257 X |
| 3,289,089 | 11/1966 | Linder .......................... | 307/241 X |
| 3,501,751 | 3/1970 | Gerrard ........................ | 307/242 X |

*Primary Examiner*—Roy Lake
*Assistant Examiner*—James B. Mullins
*Attorney*—Maleson, Kimmelman and Ratner

ABSTRACT: A differential switching system for switching low-level signals in the presence of high-level unwanted signals having a first and a second pair of diodes in which for each pair similar-type electrodes are connected together to form a first and a second junction. A first and a second transistor are respectively connected to the first and second junction and one diode of each pair if connected to a differential amplifier. Switching signals are applied to the first and second transistors for (1) reverse-biassing the diode pairs thereby gating off the switching system and (2) to turn on the diode pairs thereby gating on the switching system.

INVENTOR
DON N. LEE
BY
Malcolm, Kimmelman and Ratner
ATTORNEYS.

INVENTOR
DON N. LEE
BY
Malson, Kimmelman and Ratner
ATTORNEYS.

DIFFERENTIAL SWITCHING SYSTEM FOR SWITCHING LOW-LEVEL SIGNALS

BACKGROUND OF THE INVENTION

A. Field of the Invention

This invention relates to the field of art of switching low-level signals in the presence of high-level unwanted noise signals.

B. Prior Art

In switching low-level signals various switching devices are known, such as reed relays. However, reed relays are relatively slow in operation and require, for example, 2 milliseconds to switch. In addition during the switch time the contacts are physically moving and thus cut flux lines produced by the relay coil. In this manner noise is generated of substantial magnitude as for example 2 or 3 millivolts. In addition since a reed relay is a mechanical device it has a finite life. Saturated transistors have also been used for switching low-level signals. In a specific application saturated transistors have been employed as the chopper device in a chopper-stabilized amplifier. However, such transistor switches are substantially slow in operation and may provide a frequency of operation of less than 100 kHz. Another important disadvantage of such transistor switches has been in providing a finite offset voltages as for example, several millivolts. Since low-level input signals are being switched, offset voltages of this magnitude comprise a substantial percentage of the input signal.

Another device used in switching low-level signals has been field effect transistors (FET). When in an on state a FET provides a series resistance of 1 to 200 ohms, for example. Similarly, the device connected to the FET switch usually has a finite input impedance, 1 to 5,000 ohms, for example. When the FET switch is turned on, there is produced attenuation in a DC sense and distortion in a frequency sense as a result of the resistance of the switch. An additional disadvantage is that the FET switch requires a substantially large value of voltage for gating. As a result of the large value of input capacitance of the FET switch a high-value transient is generated at the output of the switch.

Diode bridges have historically been used to switch low-level signals. However, a major disadvantage of such diode bridges is the requirement of matched strobe pulses applied across opposite vertices of the bridge. If such strobe pulses are not exactly matched, any such mismatch will appear at the output of the switch resulting in a substantial unwanted signal. A further disadvantage is that a diode bridge is a single-ended device. Thus in order to feed a differential device, a pair of bridges together with two sets of strobe pulse generators have been required.

SUMMARY OF THE INVENTION

A differential switching system for switching low-level signals in the presence of high-level unwanted signals. A first pair of unidirectional devices have similar-type electrodes connected together to form a first junction and a second pair of unidirectional devices have similar-type electrodes connected together to form a second junction. First and second switching means are respectively connected to the first and second junction. Another electrode of a first device of the first pair is coupled to an input of a differential amplifier and another electrode of a first device of the second pair is coupled to another input of the amplifier. The input connections to the switching system are respectively coupled to other electrodes of second devices of the pairs. In operation, a first signal switches the first and second switching means to a first state thereby turning off the first and second pairs to effectively isolate to a high degree the inputs from the outputs of the switching system. A second signal switches the first and second switching means to a second state thereby turning on the first and second pairs to effectively directly connect the inputs to the outputs of the system.

BRIEF DESCRIPTION OF THE DRAWINGS

Referring now to FIG. 1 there is sown a low-level differential switching system 10 having inputs 15*a*, *b* and outputs 16*a*, *b* for switching low-level differential signals produced in a sense line 11. It will be understood that system 10 may also be use for switching single-ended signals. Sense line 11 may be threaded through a plurality of cores 14 (only two of which have been illustrated) to be tested in the manner described for example in TENTATIVE METHODS OF TEST FOR NON-METALLIC MAGNETIC CORES TO BE USED IN A COINCIDENT CURRENT MEMORY WITH A TWO-TO-ONE SELECTION RATIO OPERATING UNDER FULL SWITCHING CONDITIONS-ASTM designation: C526—63T, issued 1963. Sense line ends 11*a*, *b* are connected to system inputs 15*a*, *b* respectively. With system 10 gated on input 15*a* is effectively directly connected to output 16*a* and input 15*b* is effectively directly connected to output 16*b*. With system 10 gated off, input 15*a* is effectively isolated from output 16*a* and input 15*b* is effectively isolated from output 16*b*.

Figure 2:
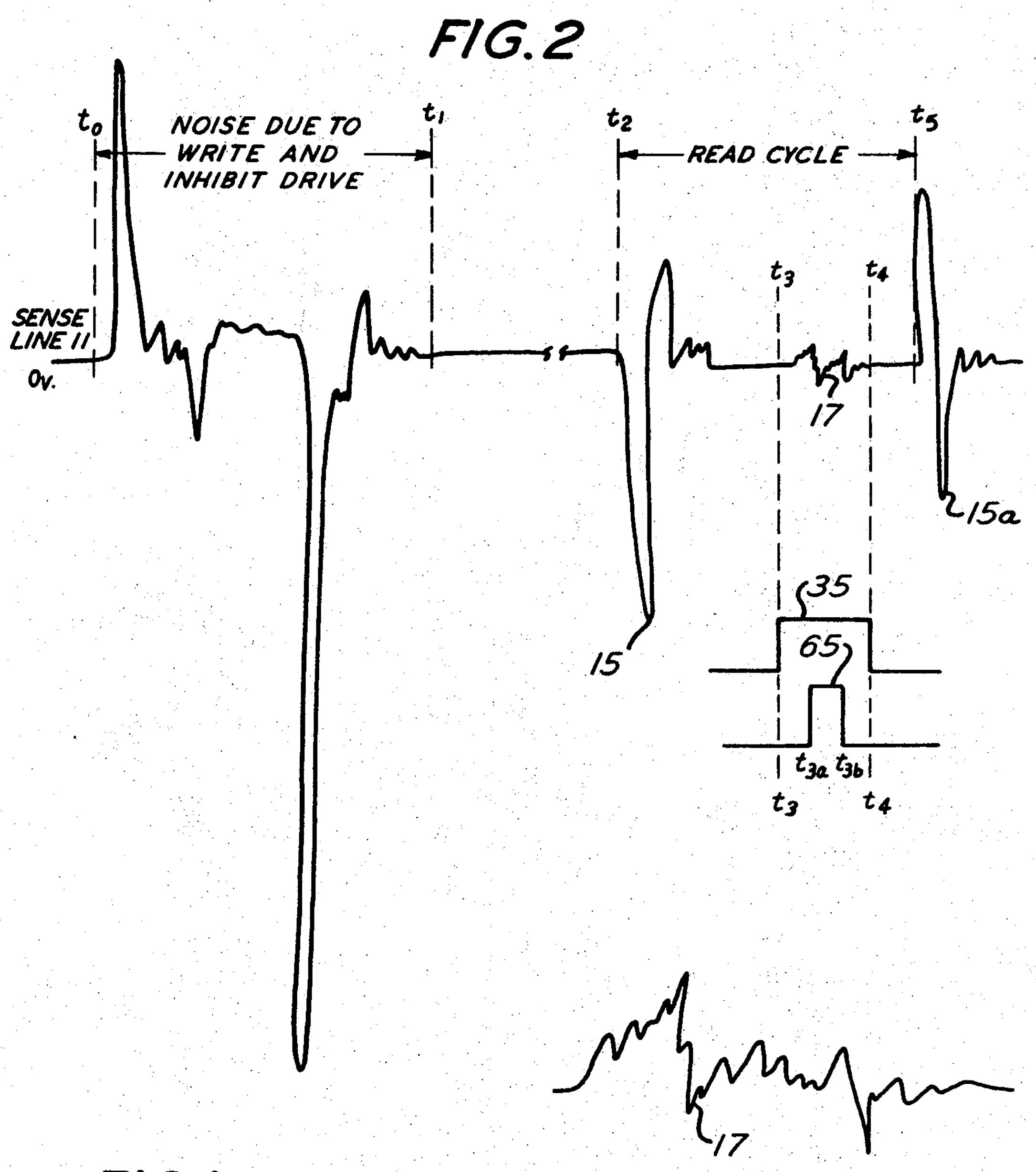
FIG. 2 illustrates waveforms helpful in understanding the invention.

Accordingly, write, inhibit and read current pulses may be applied through lines, not shown, to drive cores 14 in accordance with the foregoing core-testing procedures. Such drive lines may be X- Y-lines and the current pulses through these lines in practice may be capacitively and magnetically coupled to sense line 11 thereby producing noise signals as shown in FIG. 2. Specifically between times $t_0$ and $t_1$ write and inhibit drive current pulses on the X- Y-lines may produce the illustrated noise signals between these times. Similarly between times $t_2$ and $t_5$ the leading and trailing edges of a read drive current pulse through a read line (not shown) may produce undesirable read cycle transients 15 and 15*a*.

A desired read signal 17 being read from a selected one of the cores 14 occurs at a predetermined time after the leading edge of the read drive current pulse. Accordingly, it is known to gate on switching system 10 only between times $t_3$ and $t_4$ thereby to apply the sense line 11 signals to a sense amplifier 20 only during that time duration. In this application of low-level switching, it is particularly important that sense amplifier 20 be isolated from line 11 except between times $t_3$ and $t_4$ since such amplifiers have previously had severe recovery problems if overloaded with the high-level noise signal produced between times $t_0$ and $t_1$, $t_2$ and $t_3$ or $t_4$ and $t_5$. These recovery problems are well known in the art since conventional sense amplifiers have capacitive inputs, input transistors which may saturate, cut off problems, etc.

The importance of switching such a low-level signal 17 in the presence of high-level unwanted noise signals will now be understood. In a particular example, low-level signal 17 may be between 2 millivolts (mv.) to 100 mv. while on the other hand the noise signal may be in the volt range such as from 3 to 40 volts. Thus a high value of isolation is required between sense amplifier 20 and sense line 11.

It will be understood that the high-level noise signals occurring between times $t_0$ and $t_1$, $t_2$ and $t_3$ and $t_4$ and $t_5$ are substantially common mode signals so that these noise signals appear at the same time at both ends 11*a* and 11*b* of sense line 11. On the other hand the desired low-level signal 17 appears at one end with respect to the other end of sense line 11. For example, signal 17 may appear at end 11*a* with respect to end 11*b* or such signal may appear at end 11*b* with respect to end 11*a*. Thus signal 17 is defined as a differential signal. Accordingly, it is a function of switching system 10 to recover that differential signal 17 and to apply it to sense amplifier 20. It will also be understood that signal 17 is injected on top of the noise signals on sense line 11 and it is also a function of switching system 10 to ignore such residual common mode noise being generated and to only recover the wanted differential signal 17. Thus to provide the foregoing functions switching system 10 is required to operate as a differential switch.

Figure 3:
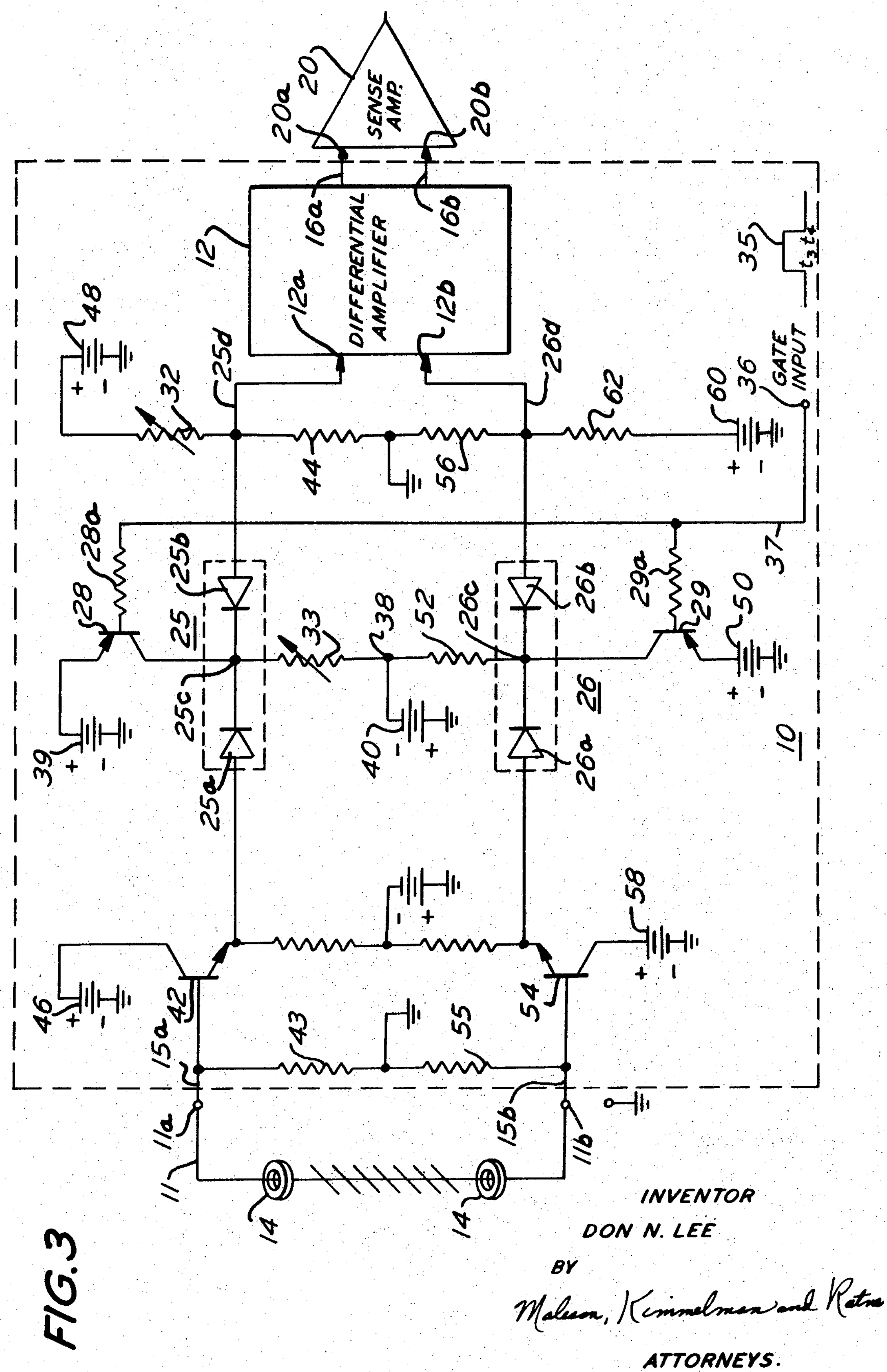
FIG. 3 illustrates in schematic form the details of the switching system in accordance with the invention.

Switching system 10 is shown in detail in FIG. 3 and comprises first and second diode gates 25 and 26 respectively which feed differential inputs 12*a* and 12*b* respectively of a unity gain differential amplifier 12. Diode gate 25 comprises a pair of diodes 25*a*, *b* with the cathodes of the diodes connected together at a junction 25*c*. Similarly, diode gate 26 comprises a pair of diodes 26*a*, *b* with the cathodes of the diodes connected together at a junction 26*c*. In this manner, in each of the gates, similar-type electrodes are connected together to form a respective junction.

Diode gates 25 and 26 are simultaneously switched by respective PNP switching transistors 28 and 29. In order to control the conductivity states of the switching transistors a common gating signal 35 is applied by way of a gate input terminal 36 and conductor 37 to the bases of transistors 28 and 29 by way of base resistors 28*a* and 29*a* respectively. When gate signal 35 is at a lower potential level, switching transistors 28 and 29 are turned on (the normal condition of the switching transistors) and accordingly gates 25 and 26 are turned off. On the other hand when gating signal 35 is at its higher potential level, transistors 28 and 29 are turned off and accordingly gates 25 and 26 are turned on.

With transistor 28 turned on, a circuit may be traced by way of the positive side of a supply battery 39, the emitter, base and collector of transistor 28, junction 25*c*, variable resistor 33, junction 38 and to the negative side of a common supply battery 40, the positive side of which is connected to ground. In this manner junction 25*c* assumes the emitter voltage of transistor 28 which is the positive potential of battery 37. As a result, diodes 25*a*, *b* are reverse-biased. Specifically, diode 25*a* is maintained off since its anode is connected by way of the emitter base junction of an NPN-emitter-follower transistor 42 and a resistor 43 to ground. Similarly, diode 25*b* is maintained off since its anode is connected by way of a resistor 44 to ground.

At time $t_3$ the higher potential level of pulse 35 is effective to turn off transistor 28 and thus current flow through diode 25*a* may be traced by way of the positive side of a battery 46, the collector, base and emitter of transistor 42, diode 25*a*, junction 25*c*, variable resistor 33, junction 38 and to battery 40. Similarly, current flow through diode 25*b*may be traced by way of the positive side of battery 48, variable resistor 32, diode 25*b*, junction 25*c*, resistor 33, junction 38 and to battery 40. Accordingly, current flows through both diodes 25*a*, *b* and thus these diodes operate as an effective short circuit between emitter-follower 42 and differential input 12*a*.

At time $t_4$ the lower potential level of pulse 35 is effective to turn on transistor 28 and gate 25 is turned off in the manner previously described.

The operation of transistor 29 and gate 26 is similar to that of transistor 28 and gate 25. Specifically, prior to time $t_3$ with transistor 29 turned on, a circuit may be traced by way of the positive side of a battery 50, the emitter, base and collector of transistor 29, junction 26*c*, resistor 52, junction 38 and to the negative side of battery 40. In this manner junction 26*c* assumes the emitter voltage of transistor 29 which is the positive potential of battery 50 resulting in the reverse-biassing of diodes 26 *a*, *b*. Specifically, diode 26*a* is maintained off since its anode is connected by way of the emitter-base junction of an NPN-emitter-follower transistor 54 and a resistor 55 to ground. Similarly, diode 26*b* is maintained off since its anode is connected by way of a resistor 56 to ground.

At time $t_3$, the higher positive level of pulse 35 is effective to turn off transistor 29 and thus current flow through diode 26*a* may be traced by way of the positive side of a battery 58, the collector, base and emitter of transistor 54, diode 26*a*, junction 26*c*, resistor 52, junction 38 and to battery 40. Similarly, current flow through diode 26*b* may be traced by way of the positive side of a battery 60, resistor 62, diode 26*b*, junction 26*c*, resistor 52 and to battery 40. Accordingly, current flows through diodes 26*a*, *b* and thus these diodes operate as an effective short circuit between emitter-follower 54 and differential input 12*b*.

At time $t_4$, the lower potential level of pulse 35 is effective to turn on transistor 29 thereby turning off gate 26 in the manner previously described.

It will be understood that when gates 25 and 26 are turned on at time $t_3$ and turned off at time $t_4$ that transients are generated on lines 25*d* and 26*d* which are applied to differential inputs 12*a*, *b* respectively. It is required that these transients be essentially equal in time and duration so that they are common mode and will thus be cancelled out by differential amplifier 12. In order to assure that these transients will be substantially equal, resistors 32 and 33 may be varied in resistance value. Resistor 32 varies the current through diode 25*b* and resistor 33 varies the current through diode 25*a* so that the voltage drop across diode 25*b* is matched to the voltage drop across diode 26*b* and the voltage drop across 25*a* is matched to the voltage drop across diode 26*a*. In this manner any offsets produced by these diodes are made equal and it is such offsets which produce a substantial portion of the transients. In order to further minimize such offsets and to provide low level of transients diodes 25*a*, *b* and diodes 26*a*, *b* are matched. Accordingly, the transients produced when switching system 10 is turned on are substantially equal and in the same direction. Accordingly, differential amplifier 12 substantially cancels such common mode transients and they do not interfere with the operation of sense amplifier 20.

In addition, diodes 25*a*, *b* and 26*a*, *b* are selected to have a high conductance value. Accordingly, switching system 10 provides a substantially low resistance value between switching system inputs 15*a*, *b* and outputs 16*a* *b* typically less than 10 ohms. In a typical embodiment the diodes 25*a*, *b* and 26*a*, *b* may be Hewlett-Packard Associates diode model numbers 1034 matched for forward voltage drops to within 5 mv. from 1 to 15 ma.

A further advantage of the present invention is in bandwidth. Read signal 17 may exist for only a substantially short time duration as for example, between 5 and 15 nanoseconds. Accordngly, system 10 is required to have a bandwidth compatible with the time duration of signal 17. Such a bandwidth may be of value greater than 100 mHz.

Thus in accordance with the invention there is provided by the use of four diodes and a differential amplifier 12, a differential switching system for switching low-level differential or single-ended signals in the presence of high-level unwanted signals such as noise without the requirement of complex circuits.

Figure 1:
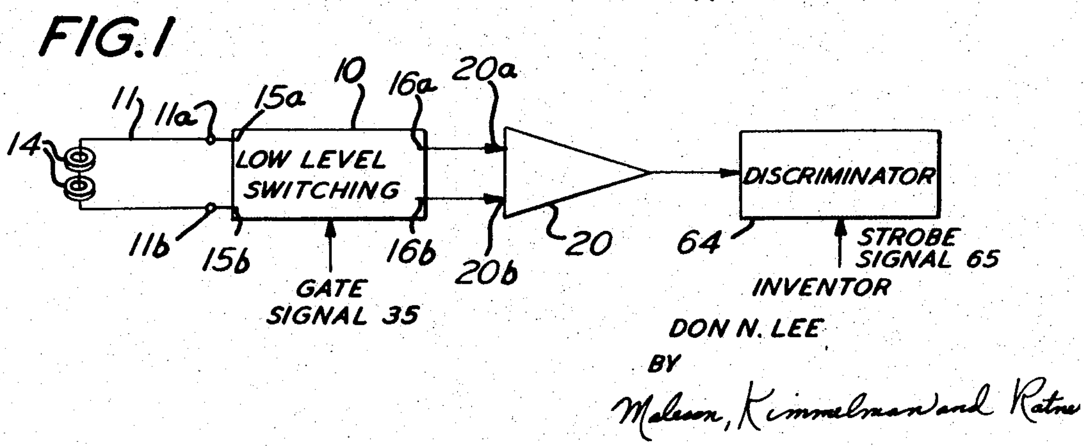
FIG. 1 illustrates in block diagram form a differential switching system for switching signals produced in a sense line for application to a sense amplifier.

In the application of low-level switching system 10 of FIG. 1, the output of sense amplifier 20 is applied to a discriminator 64. Discriminator 64 operates upon application of a strobe signal 65 which begins at time $t_3a$ and terminates at time $t_3b$, FIG. 2. In this manner the gate signal 35 brackets the strobe signal 65. In addition to the foregoing application, since switching system 10 has the characteristics of fast action and high isolation, it may also be used in other applications in which a low-level signal is required to be gated in the presence of high-level unwanted signals. For example, Switching system 10 may be used as a high-speed chopper, as a medium-speed low-level signal slicer, as a medium-speed low-level differential sample-and-hold circuit, etc.

It will be understood that in another embodiment of the invention the diodes (unidirectional devices) of the first and second diode gates 25 and 26 may be reversed from that illustrated in FIG. 3. Specifically, the anodes of diodes 25*a*, *b* may be connected together at junction 25*c* and the anodes of diodes 26*a*, *b* may be connected together at junction 26*c*. Accordingly, NPN-transistors are substituted for PNP-transistors 28 and 29 and batteries 39, 40, 48, 50 and 60 are reversed in polarity from that illustrated. In addition, gate signal 35 is reversed from that illustrated. Thus, between times $t_0$ and $t_3$ (first switching signal) the NPN-transistors are turned on and the negative potential of batteries 39 and 50 are applied by way of the emitter, base and collector of the NPN-transistors to junctions 25*c* and 26*c* respectively thereby reverse-biassing the diodes. Between times $t_3$ and $t_4$ (second switching signal) The NPN-transistors are turned off and the diodes are turned on.

What is claimed is:

1. A differential switching system for switching low-level signals in the presence of high-level unwanted signals having a first and a second input and a first and a second output comprising differential amplifier means having a first and a second output terminal coupled respectively to said first and second outputs, a first pair of diodes having similar-type electrodes connected together to form a first junction, a second pair of diodes having similar-type electrodes connected together to form a second junction, first transistor switching means connected to said first junction for turning on and off said first diode pair in response to applied switching signals, second transistor switching means connected to said second junction for turning on and off said second diode pair in response to said applied switching signals, another electrode of a first diode of said first pair being connected to one input of said differential amplifier means, another elelctrode of a first diode of said second pair being connected to another input of said differential amplifier means, means connecting another electrode of a second diode of said first pair to said first input and means connecting another electrode of a second diode of said second pair to said second input, and means for applying to said first and second switching means (1) a first switching signal for switching said first and second switching means to a first state thereby reverse-biassing and turning off said first and second diode pairs and effectively isolating to a high degree said first and second inputs from said first and second outputs respectively and (2) a second switching signal for switching said first and second switching means to a second state to turn on said first and second diode pairs to effectively directly connect said first and second inputs to said first and second outputs respectively.

2. The differential switching system of claim 2 in which there is provided for each pair of diodes a first resistor connected between the respective junction and a common source of supply, said first and second transistor switching means comprising first and second transistors each having an electrode connected to a respective first source of supply whereby upon application of said first switching signal said first and second transistors are turned on and the potential of the respective first source of supply is applied to said first and second junctions thereby to reverse-bias said first and second diode pairs.

3. The differential switching system of claim 2 in which there is provided for each pair of diodes a second resistor connected between a respective second source of supply and said other electrode of a respective first diode whereby upon application of said switching signal said first and second transistors are turned off and current flows between said common and second source of supply through said second resistor, said first diode and said first resistor.

4. The differential switching system of claim 3 in which there is provided for each pair of diodes an emitter-follower transistor the emitter of which is connected to the other electrode of the respective second diode and the collector of which is connected to a respective third source of supply whereby upon application of said second switching signal, said first and second transistors are turned off and current flows between said common and third source of supply through the emitter-follower transistor, said second diode and said first resistor.

5. The differential switching system of claim 4 in which the second resistor of said first pair of diodes may be varied in resistance value thereby to vary the value of the current flow through said first diode of said first pair and in which the first resistor of said first pair of diodes may be varied in resistance value to vary the value of the current flow through said second diode of said first pair whereby the voltage drop across said first and second diodes of said first pair may be respectively matched to the voltage drops across said first and second diodes of said second pair thereby to minimize offsets.

6. The differential switching system of claim 2 in which there is provided common supply source means connected to said first and second junctions, and in which there is provided for each pair of diodes transistor means a first terminal of which is connected to the other electrode of the respective second diode and a second terminal of which is connected to a respective additional supply source means whereby upon application of said second switching signal current flows between said common and additional supply source means through said transistor means and said second diode.

7. The differential switching system of claim 6 in which said diodes of said first and second pair are selected to have a high conductance value thereby to provide a substantially low value of resistance between said first and second inputs and said first and second outputs respectively.

8. The differential switching system of claim 6 in which the cathodes of said first pair of diodes are connected together to form said first junction and the cathodes of said second pair of diodes are connected together to form said second junction.

9. A differential system for switching low-level differential signals in the presence of substantially common mode high-level noise signals produced in a magnetic core sense line to a sense amplifier comprising, said switching system having a first and a second input connected to respective ends of said sense line and a first and a second output connected to respective inputs of said sense amplifier, a differential amplifier having a first and a second input terminal and having a first and a second output terminal coupled respectively to said first and said second outputs, a first pair of diodes forming a first diode gate and having similar-type electrodes coupled together to form a first junction, a second pair of diodes forming a second diode gate and having similar-type electrodes connected together to form a second junction, a first switching transistor having the collector thereof connected to said first junction and a second switching transistor having the collector thereof connected to said second junction, another electrode of a first diode of said first diode gate being connected to said first input of said differential amplifier, another electrode of a first diode of said second diode gate being connected to said second input of said differential amplifier, first input means coupling another electrode of a second diode of said first diode gate to said first input and second input means coupling another electrode of a second diode of said second diode gate to said second input, and gate signal means for applying to said first and second transistors (1) a first switching signal for switching said first and second transistors to a first state thereby reverse-biassing and turning off said first and second diode gate and effectively isolating to a high degree said sense line from said sense amplifier and (2) a second switching signal for switching said first and second transistors to a second state to turn on said first and second diode gates thereby to recover said differential signal and apply it to said sense amplifier.

10. The differential switching system of claim 9 in which there is provided common supply source means connected to said first and second junctions, and in which there is provided for each pair of diodes transistor means a first terminal of which is connected to the other electrode of the respective second diode and a second terminal of which is connected to a respective additional supply source means whereby upon application of said second switching signal current flows between said common and additional supply source means through said transistor means and said second diode.

11. The differential switching system of claim 9 in which there is provided for each diode gate a first resistor connected between the respective junction of the pair of diodes and a common source of supply, each of said first and second transistors having an electrode connected to an individual first source of supply whereby upon application of said first switching signal said first and second transistors are turned on and the potential of each first source of supply is applied to said first and second junctions thereby to reverse-bias the diodes of said first and second diode gates.

* * * * *